(12) United States Patent
Liu

(10) Patent No.: US 11,704,788 B2
(45) Date of Patent: Jul. 18, 2023

(54) SECONDARY DETECTION SYSTEM FOR INTEGRATING AUTOMATED OPTICAL INSPECTION AND NEURAL NETWORK AND METHOD THEREOF

(71) Applicants: Inventec (Pudong) Technology Corporation, Shanghai (CN); Inventec Corporation, Taipei (TW)

(72) Inventor: Hao Liu, Shanghai (CN)

(73) Assignees: Inventec (Pudong) Technology Corporation, Shanghai (CN); Inventec Corporation, Taipei (TW)

(*) Notice: Subject to any disclaimer, the term of this patent is extended or adjusted under 35 U.S.C. 154(b) by 331 days.

(21) Appl. No.: 17/205,995

(22) Filed: Mar. 18, 2021

(65) Prior Publication Data
US 2022/0292659 A1 Sep. 15, 2022

(30) Foreign Application Priority Data
Mar. 10, 2021 (CN) .......................... 202110259803.9

(51) Int. Cl.
*G06T 7/00* (2017.01)
*G06V 10/44* (2022.01)
*G06N 3/048* (2023.01)

(52) U.S. Cl.
CPC .............. *G06T 7/001* (2013.01); *G06N 3/048* (2023.01); *G06V 10/44* (2022.01); *G06T 2207/20076* (2013.01); *G06T 2207/20084* (2013.01); *G06T 2207/30152* (2013.01)

(58) Field of Classification Search
CPC .......... G06T 7/001; G06T 2207/20076; G06T 2207/20084; G06T 2207/30152; G06N 3/048; G06V 10/44
See application file for complete search history.

(56) References Cited

U.S. PATENT DOCUMENTS
2020/0090319 A1* 3/2020 Liao .................... G06N 3/08

FOREIGN PATENT DOCUMENTS
CN 113971654 A * 1/2022

* cited by examiner

*Primary Examiner* — Pinalben Patel
(74) *Attorney, Agent, or Firm* — David R. Stevens; Stevens Law Group

(57) ABSTRACT

A secondary detection system for integrating automated optical inspection and neural network and a method thereof are disclosed. In the secondary detection system, an automated optical inspection apparatus performs automated optical inspection for pin solder joints on circuit board, and when a detection result indicates abnormal condition, the secondary detection device calculates a detection image probability value based on the component image feature and the template image feature, and calculate pin solder joint image probability values based on the component pin solder joint image feature and the template pin solder joint image feature through siamese neural network, to obtain a minimum probability value among the detection image probability value and pin solder joint image probability values. The minimum probability value is used to determine whether to change the detection result, thereby providing accurate detection result of automated optical inspection and increasing a first pass yield.

10 Claims, 7 Drawing Sheets

311

321

SECONDARY DETECTION SYSTEM FOR INTEGRATING AUTOMATED OPTICAL INSPECTION AND NEURAL NETWORK AND METHOD THEREOF

BACKGROUND OF THE INVENTION

1. Field of the Invention

The present invention is related to an inspection system and a method thereof, and more particularly to a secondary detection system for integrating automated optical inspection and neural network and a method thereof.

2. Description of the Related Art

An automated optical inspection apparatus is an inspection apparatus based on optical principles. The automated optical inspection apparatus can be used to inspect common defects of electronic components on the circuit board during the pin soldering process. The automated optical inspection apparatus uses a camera device to capture an image of the circuit board, and then compares each pin solder joint with the pre-established solder joint qualification parameters, one by one, so as to detect the pin solder joint defect of the electronic component on the circuit board. Furthermore, the pin solder joint defect of the electronic component on the circuit board can be displayed on a display device or marked by an automatic marking manner, for maintenance personnel to perform recondition.

However, in practical use, the circuit board is mounted with a large amount of electronic components, and it may cause a first pass yield of automated optical inspection, that is, most of the electronic components are indicated as abnormal in the automated optical inspection result. The conventional manner of increasing the first pass yield of the automated optical inspection result requires engineers to spend a lot of time and energy to repeatedly adjust qualification parameters for a specific circuit board, so the conventional manner has no versatility.

Therefore, what is needed is to develop an improved technical solution to solve the problem that the conventional automated optical inspection for electronic component pin solder joints has a too low performance.

SUMMARY OF THE INVENTION

An objective of the present invention is to provide a secondary detection system for integrating automated optical inspection and neural network and a method thereof, so as to solve the conventional technical problem that the conventional automated optical inspection for electronic component pin solder joints has a too low performance.

In order to achieve the objective, the present invention provides a secondary detection system for integrating automated optical inspection and neural network, and the secondary detection system includes an automated optical inspection apparatus and a secondary detection device. The secondary detection device includes a receiving module, an image capture module, an image query module, a pin solder joint image module, an image feature module, a probability calculation module and a result determining module.

The automated optical inspection apparatus is configured to perform automated optical inspection for pin solder joints on a circuit board, wherein when a detection result of the automated optical inspection for pin solder joints indicates an abnormal condition, the automated optical inspection apparatus provides an inspection image and detection result information of the automated optical inspection.

The receiving module is configured to receive the inspection image and the detection result information from the automated optical inspection apparatus. The image capture module is configured to capture a component image corresponding to an electronic component image scope in the inspection image according to electronic component information and location information contained in the detection result information. The image query module is configured to query a template image according to circuit board information contained in the detection result information. The pin solder joint image module is configured to capture a component pin solder joint image for each of pin solder joints in the component image and capture a template pin solder joint image for each of pin solder joints in the template image. The image feature module is configured to perform image feature extraction on the component image to generate a component image feature, perform image feature extraction on the template image to generate a template image feature, perform image feature extraction on the component pin solder joint image to generate a component pin solder joint image feature, and perform image feature extraction on the template pin solder joint image to generate a template pin solder joint image feature, through convolution neural network. The probability calculation module is configured to calculate a detection image probability value based on the component image feature and the template image feature and calculate a plurality of pin solder joint image probability value based on the component pin solder joint image feature and the template pin solder joint image feature corresponding to each other, through the siamese neural network. The result determining module configured to obtain a minimum probability value among the detection image probability value and the plurality of pin solder joint image probability values, wherein when the minimum probability value is higher than or equal to a threshold value, the result determining module changes the detection result of the automated optical inspection apparatus to a normal condition, and when the minimum probability value is lower than the threshold value, the result determining module does not change the detection result of the automated optical inspection apparatus.

In order to achieve the objective, the present invention provides a secondary detection method for integrating automated optical inspection and neural network, and the secondary detection method includes steps of: using an automated optical inspection apparatus to perform automated optical inspection for pin solder joints on a circuit board; when a detection result of the automated optical inspection for the pin solder joints indicates an abnormal condition, using the automated optical inspection apparatus to provide an inspection image and detection result information of the automated optical inspection to a secondary detection device; using the secondary detection device to capture a component image within an electronic component image scope in the inspection image according to electronic component information and location information contained in the detection result information; using the secondary detection device to query a template image according to circuit board information contained in the detection result information; using the secondary detection device to capture a component pin solder joint image for each of the pin solder joints in the component image; using the secondary detection device to capture a template pin solder joint image for each of the pin solder joints in the template image; using the secondary detection device to perform image feature extraction on the component image to generate a component image feature through a convolution neural network; using the secondary detection device to perform image feature extraction on the template image to generate a template image feature through a convolution neural network; using the secondary detection device to perform image feature extraction on the component pin solder joint image to generate a component pin solder joint image feature through a convolution neural network; using the secondary detection device to perform image feature extraction on the template pin solder joint image to generate a template pin solder joint image feature through a convolution neural network; using the secondary detection device, to calculate a detection image probability value based on the component image feature and the template image feature, through the siamese neural network; using the secondary detection device, to calculate a plurality of pin solder joint image probability values based on the component pin solder joint image feature and the template pin solder joint image feature corresponding to each other; using the secondary detection device to obtain a minimum probability value among the detection image probability value and the plurality of pin solder joint image probability values; when the minimum probability value is higher than or equal to a threshold value, using the secondary detection device to change the detection result of the automated optical inspection apparatus to a normal condition; when the minimum probability value is lower than the threshold value, maintaining the detection result of the automated optical inspection apparatus.

According to the above-mentioned contents, the difference between the system and method of the present invention and the conventional technology is that the automated optical inspection apparatus can perform automated optical inspection for the pin solder joints on the circuit board, and when the detection result indicates an abnormal condition, the secondary detection device calculates a detection image probability value based on the component image feature and the template image feature through the siamese neural network, and calculates the plurality of pin solder joint image probability values based on the component pin solder joint image feature and the template pin solder joint image feature corresponding to each other, through siamese neural network, so as to obtain the minimum probability value among the detection image probability value and the plurality of pin solder joint image probability values; when the minimum probability value is higher than or equal to the threshold value, the detection result of the automated optical inspection apparatus is changed to a normal condition, and when the minimum probability value is lower than the threshold value, the detection result of the automated optical inspection apparatus is not changed.

According to the aforementioned technical solution, the present invention can achieve the technical effect of providing an accurate detection result of automated optical inspection and increasing a first pass yield.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
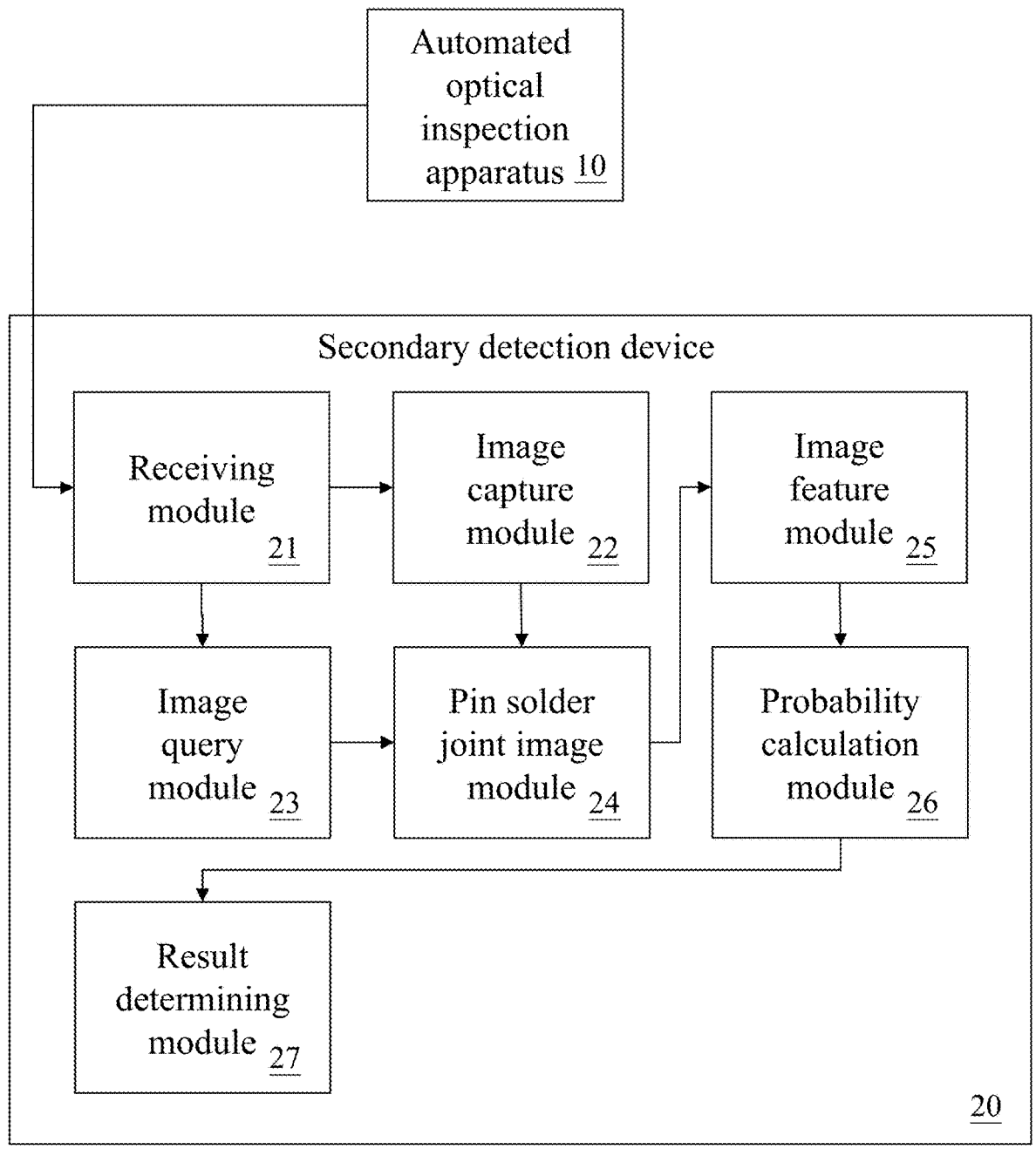
FIG. 1 is a system block diagram of a secondary detection system for integrating automated optical inspection and neural network, according to the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to he acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

The implementation of the present invention will be illustrated in detail with reference to the accompanying drawings and embodiment, so that the implementation process of applying the technical solution of the present invention to solve technical problem and achieve technical effect will be readily apparent as the same becomes better understood for implementation.

A secondary detection system for integrating automated optical inspection and neural network of the present invention is described in the following paragraphs. Please refer to FIG. 1, which is a system block diagram of a secondary detection system for integrating automated optical inspection and neural network, according to the present invention.

As show r in FIG. 1, the secondary detection system includes an automated optical inspection apparatus 10 and a secondary detection device 20; the secondary detection device 20 includes a receiving module 21, an image capture module 22, an image query module 23, a pin solder joint image module 24, an image feature module 25, a probability calculation module 26 and a result determining module 27.

The automated optical inspection apparatus 10 is used to perform automated optical inspection for pin solder joints of the electronic components mounted on the circuit board, so as to check the soldering status. When a detection result of the automated optical inspection for the pin solder joint indicates an abnormal condition, the automated optical inspection apparatus 10 provides an inspection image and detection result information of the automated optical inspection to the secondary detection device 20.

The secondary detection device 20 can be interconnected through a wired transmission manner or a wireless transmission manner; for example, the wired transmission manner can be a power line network, and an optical network and so on; and the wireless transmission manner can be Wi-Fi, mobile communication network such as 3G, 4G, 5G and so on; however, these examples are merely for exemplary illustration, and the application field of the present invention not limited thereto.

Figure 2A:
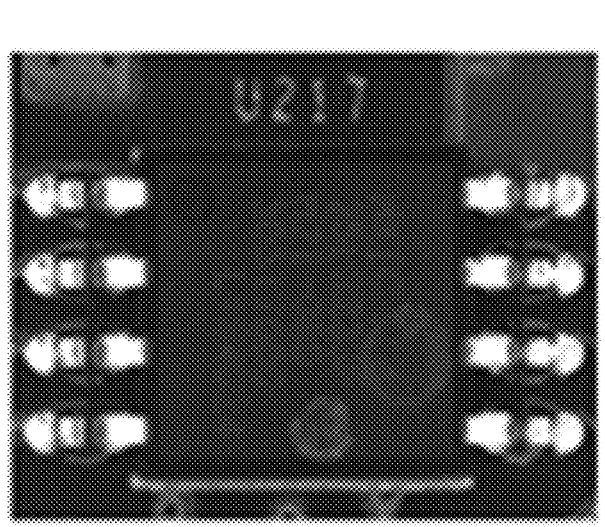
FIG. 2A is a schematic view of a component image for integration of automated optical inspection and neural network, according to the present invention.

The receiving module 21 of the secondary detection device 20 receives the inspection image and the detection result information from the automated optical inspection apparatus 10, and the image capture module 22 of the secondary detection device 20 then captures a component image within an electronic component image scope in the inspection image according to electronic component information and location information contained in the detection result information. For example, the image capture module 22 of the secondary detection device 20 performs image capture by using location information of the detection result information as a center to find a capture scope according to the electronic component information contained in the detection result information, so as to capture the component image within the electronic component image scope in the inspection image. In an embodiment, the electronic component information and the capture scope can be pre-stored in the secondary detection device 20. FIG. 2A shows the captured component image 31, and FIG. 2A is a schematic view of a component image for integration automated optical inspection and neural network, according to the present invention.

Figure 2B:
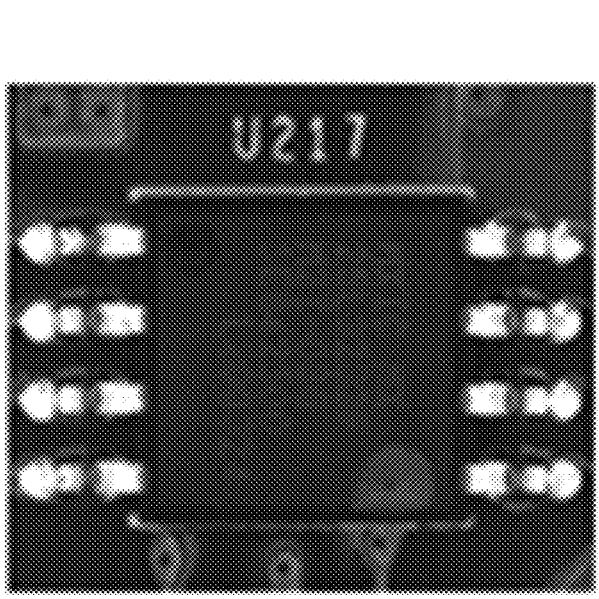
FIG. 2B is a schematic view of a template image for integration of automated optical inspection and neural network, according to the present invention.

Next, the image query module 23 of the secondary detection device 20 queries a template image 32 according to the circuit board information contained in the detection result information. FIG. 2B shows the template image 32, and FIG. 2B is a schematic view of a template image for integration of automated optical inspection and neural network, according to the present invention.

Figure 3A:
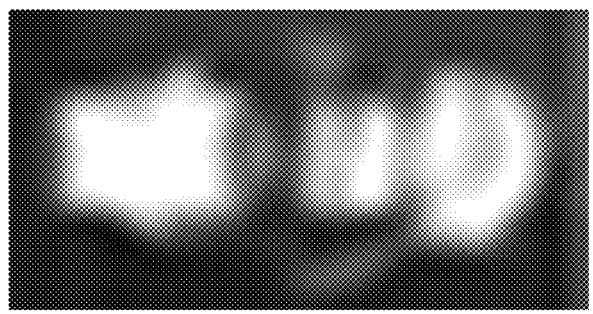
FIG. 3A is a schematic view of a secondary inspection component pin solder joint image for integration of automated optical inspection and neural network, according to the present invention.
Figure 3B:
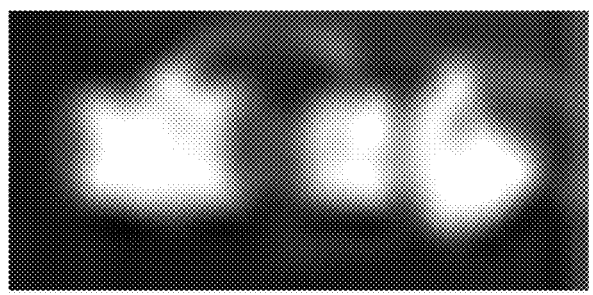
FIG. 3B is a schematic view of a secondary inspection template pin solder joint image for integration of automated optical inspection and neural network, according to the present invention.

Next, the pin solder joint image module 24 of the secondary detection device 20 captures a component pin solder joint image 311 for each of the plurality of pin solder joints in the component image 31, and capture a template pin solder joint image 321 for each of the plurality of pin solder joints in the template image 32. FIGS. 3A and 3B show the component pin solder joint image 311 captured from the component image 31 and the template pin solder joint image 321 captured from the template image 32, respectively, FIG. 3A is a schematic view of a secondary inspection component pin solder joint image for integration of automated optical inspection and neural network, according to the present invention, and FIG. 3B is a schematic view of a secondary inspection template pin solder joint image for integration of automated optical inspection and neural network, according to the present invention.

After the pin solder joint image module 24 of the secondary detection device 20 captures the component pin solder joint image 311 for each of pin solder joints in the component image 31 and captures the template pin solder joint image 321 for each of the pin solder joints in the template image 32, the image feature module 25 of the secondary detection device 20 performs image feature extraction on the component image 31 to generate a component image feature, perform image feature extraction on the template image 32 to generate a template image feature, perform image feature extraction on the component pin solder joint image to generate a component pin solder joint image feature, and perform image feature extraction on the template pin solder joint image to generate a template pin solder joint image feature, through convolution neural network.

Figure 4:
FIG. 4 is a schematic view of a secondary inspection feature matrix for integration of automated optical inspection and neural network, according to the present invention.

The image feature module 25 of the secondary detection device 20 performs image feature extraction for different image features through convolution neural network, respectively, so as to generate the feature matrixes 41 of the component image feature, the template image feature, the component pin solder joint image feature and the template pin solder joint image feature corresponding to image features. FIG. 4 schematically shows an example of the feature matrix 41. FIG. 4 is a schematic view of a secondary inspection feature matrix for integration of automated optical inspection and neural network, according to the present invention. The image feature includes a feature in a certain dimension, for example, the image feature can be lightness, color, or shape, but these examples are merely for exemplary illustration, and application field of the present invention is not limited thereto. For example, each of the component image feature, the template image feature, the component pin solder joint image feature and the template pin solder joint image feature generated by image feature extraction performed by the image feature module 25 of the secondary detection device 20 can apply single image feature or multiple image features.

Next, the probability calculation module 26 of the secondary detection device 20 calculates a detection image probability value based on the component image feature and the template image feature and calculates a plurality of pin solder joint image probability values based on the component pin solder joint image feature and the template pin solder joint image feature corresponding to each other, through siamese neural network.

In the siamese neural network used in the probability calculation module 26 of the secondary detection device 20, the template image feature is subtracted from the component image feature, a dense layer outputs an output value, and the output value is converted by a sigmoid function (S function), so as to calculate the detection image probability value. It should be noted that the detection image probability value is in a range of 0 to 1.

In the siamese neural network used in the probability calculation module 26 of the secondary detection device 20, the template pin solder joint image feature is subtracted from the component pin solder joint image feature, a dense layer outputs a pin output value, and the pin output value is converted by a sigmoid function, so as to calculate the pin solder joint image probability values. It should be noted that, the pin solder joint image probability value is in a range of 0 to 1.

Next, the result determining module 27 of the secondary detection device 20 obtains a minimum probability value among the detection image probability value and the pin solder joint image probability values calculated by the probability calculation module 26 of the secondary detection device 20, and when the minimum probability value is higher than or equal to a threshold value, the result determining module 27 changes the detection result of the automated optical inspection apparatus 10 to a normal condition; when the minimum probability value is lower than the threshold value, the result determining module 27 does not change the detection result of the automated optical inspection apparatus 10, that is, the detection result of the automated optical inspection apparatus 10 is maintained.

Therefore, the automated optical inspection apparatus 10 performs secondary automated optical inspection for the pin solder joints of the electronic components on the circuit board, when the detection result indicates an abnormal condition, the secondary detection device 20 performs inspection again, so as to accurately determine whether the pin solder joint of the electronic component on the circuit board occurs an abnormal condition, thereby reducing the amount of subsequent manual reviews for the circuit board.

Figure 5A:
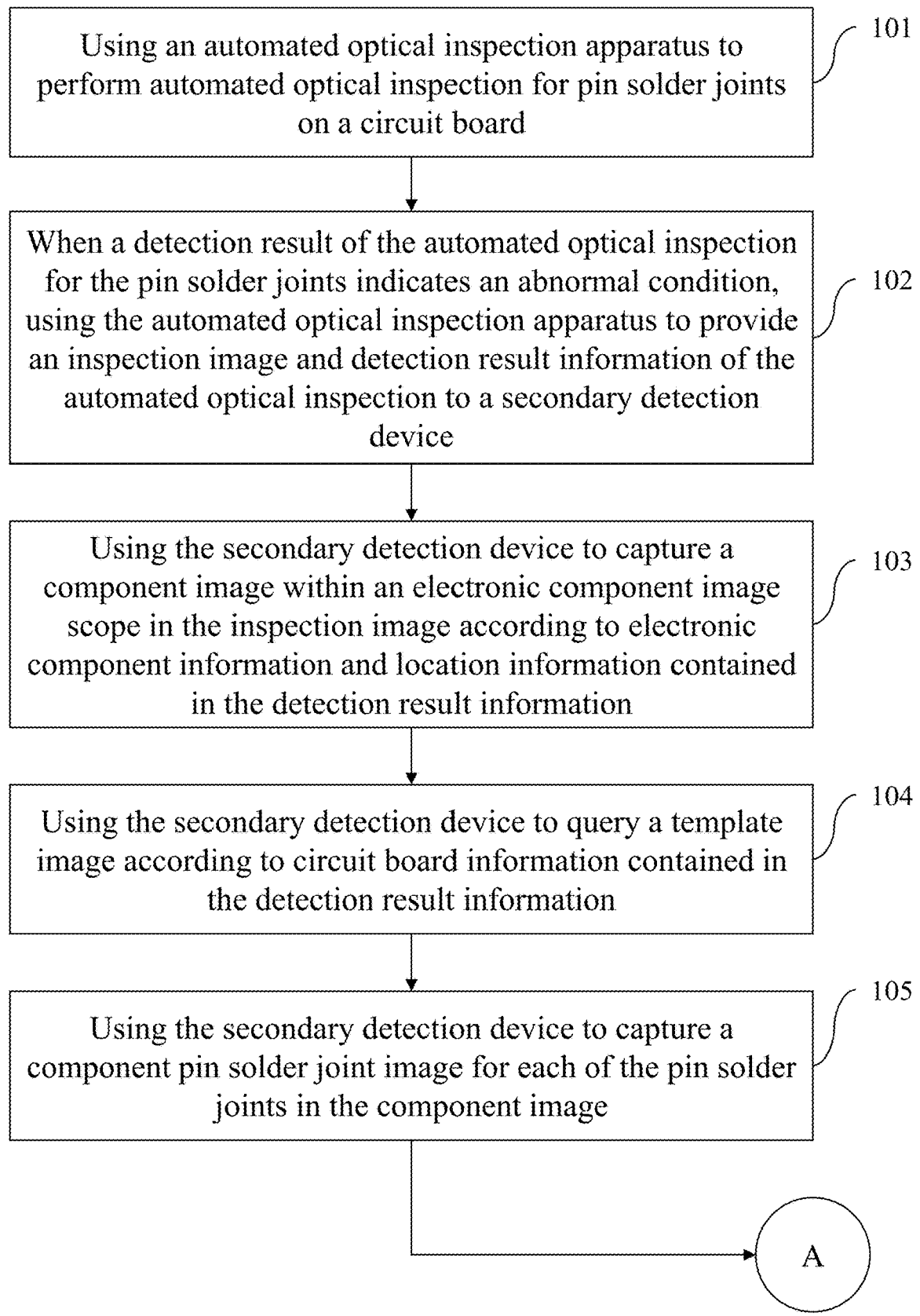
FIGS. 5A to 5C are flowcharts of a secondary detection method for integrating automated optical inspection and neural network, according to the present invention.
Figure 5B:
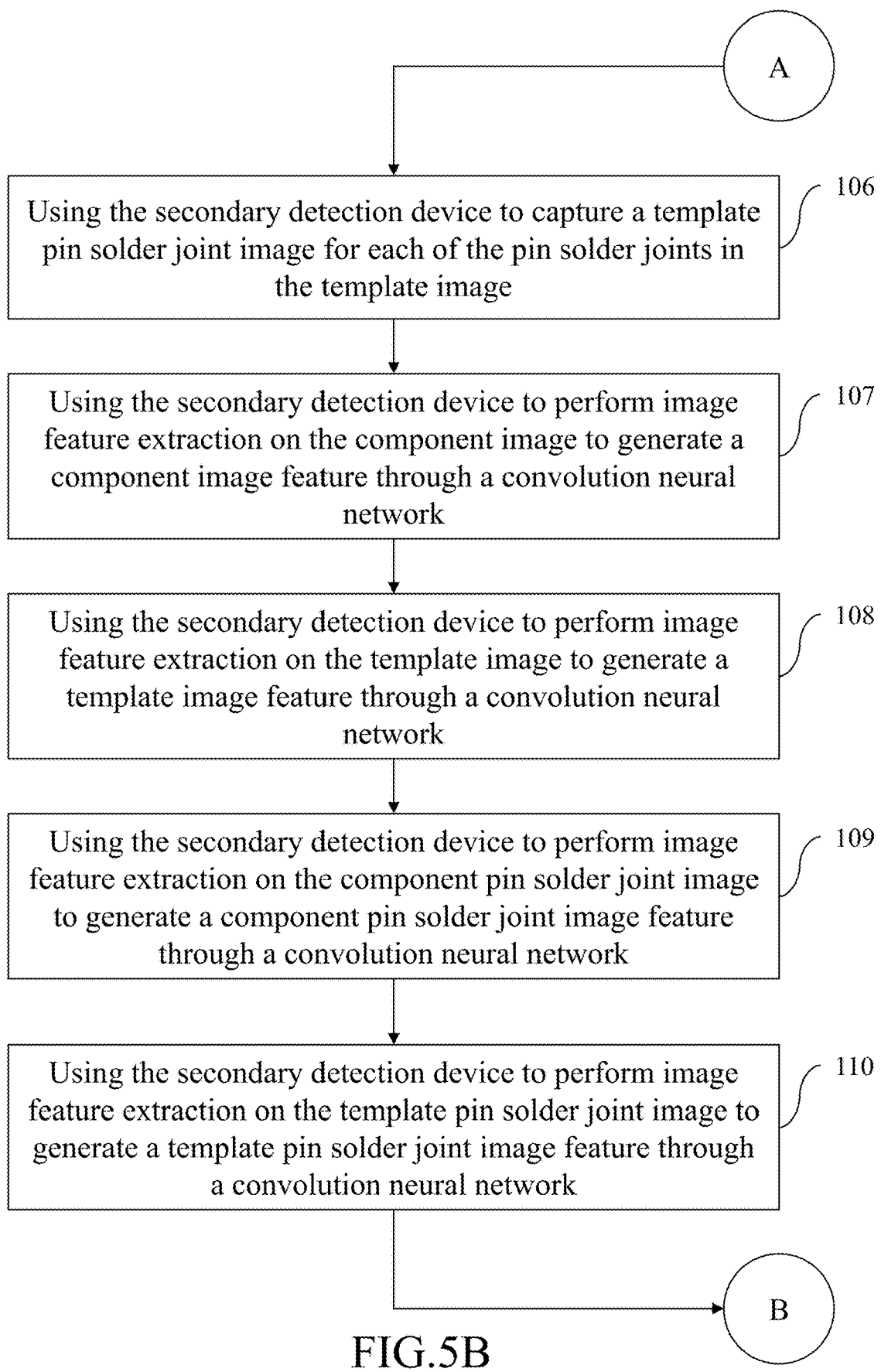
Figure 5C:
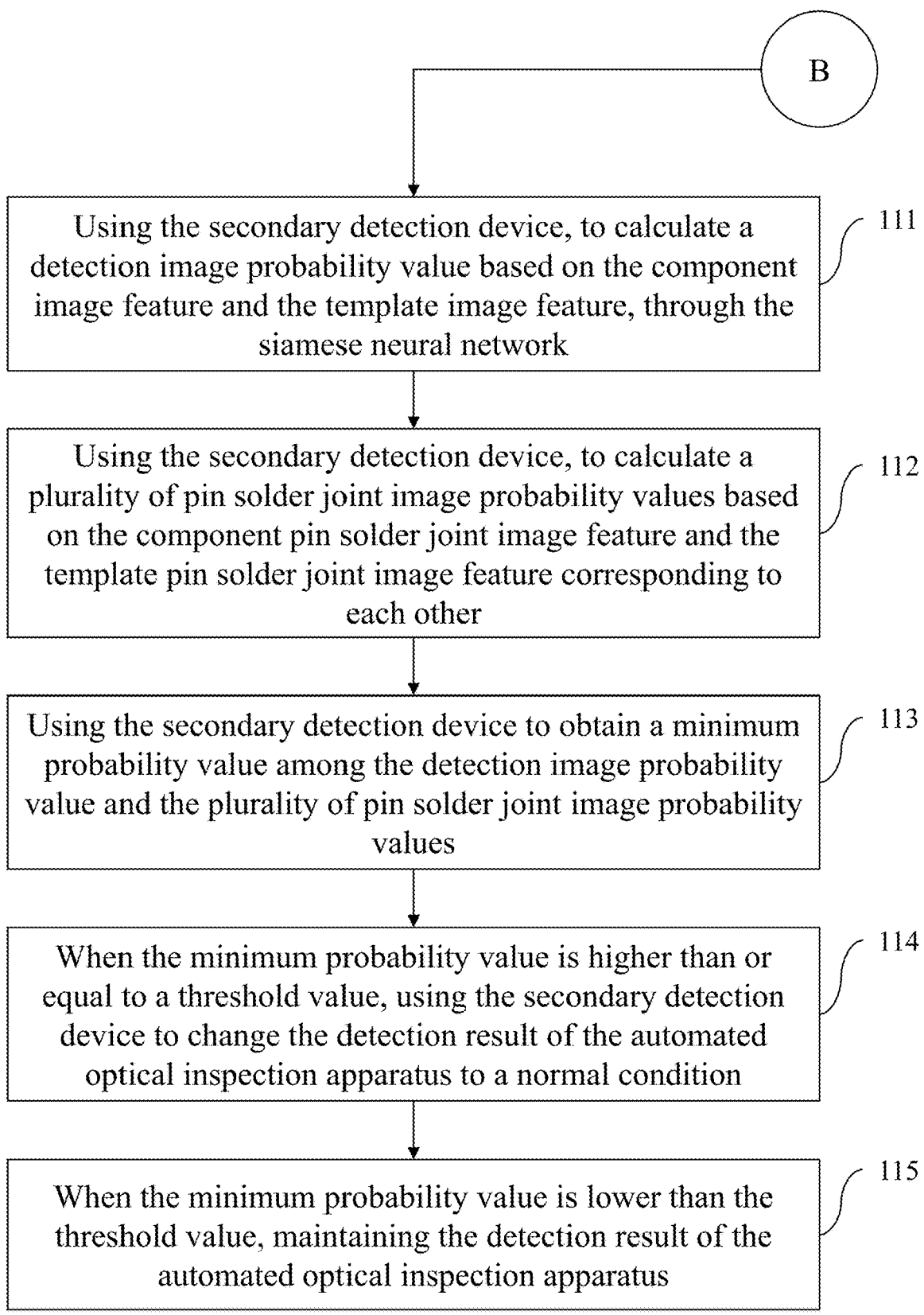

The operations of the system and the method of the first implementation aspect of the present invention is described according to a first embodiment and with reference to FIGS. 5A to 5C. FIGS. 5A to 5C are flowcharts of a secondary detection method for integrating automated optical inspection and neural network, according to the present invention.

First of all, in a step 101, an automated optical inspection apparatus is used to perform automated optical inspection for pin solder joints mounted on a circuit board. In a step 102, when a detection result of the automated optical inspection for the pin solder joint indicates an abnormal condition, the automated optical inspection apparatus provides an inspection image and detection result information of the automated optical inspection to a secondary detection device. In a step 103, the secondary detection device captures a component image within an electronic component image scope in the inspection image according to electronic component information and location information contained in the detection result information. In a step 104, the secondary detection device queries a template image according to circuit board information contained in the detection result information. In a step 105, the secondary detection device captures a component pin solder joint image for each of the pin solder joints in the component image. In a step 106, the secondary detection device captures a template pin solder joint image for each of pin solder joints in the template image. In a step 107, the secondary detection device performs image feature extraction on the component image to generate a component image feature through a convolution neural network. In a step 108, the secondary detection device performs image feature extraction on the template image to generate a template image feature through a convolution neural network. In a step 109, the secondary detection device performs image feature extraction on the component pin solder joint image to generate a component pin solder joint image feature through a convolution neural network. In a step 110, the secondary detection device performs image feature extraction on the template pin solder joint image to generate a template pin solder joint image feature through a convolution neural network. In a step 111, the secondary detection device calculates a detection image probability value based on the component image feature and the template image feature through a siamese neural network. Next, in a step 112, the secondary detection device calculate pin solder joint image probability values based on the component pin solder joint image feature and the template pin solder joint image feature corresponding to each other, through the siamese neural network. In a step 113, the secondary detection device obtains a minimum probability value among the detection image probability value and the pin solder joint image probability values. In a step 114, when the minimum probability value is higher than or equal to a threshold value, the secondary detection device changes the detection result of the automated optical inspection apparatus to a normal condition. In a step 115, when the minimum probability value is lower than the threshold value, the secondary detection device does not change the detection result of the automated optical inspection apparatus.

Therefore, the difference between the present invention and conventional technology is that the automated optical inspection apparatus can perform automated optical inspection for the pin solder joints on the circuit board, and when the detection result indicates an abnormal condition, the secondary detection device calculates a detection image probability value based on the component image feature and the template image feature through the siamese neural network, and calculates the plurality of pin solder joint image probability values based on the component pin solder joint image feature and the template pin solder joint image feature corresponding to each other, through siamese neural network, so as to obtain the minimum probability value among the detection image probability value and the plurality of pin solder joint image probability values; when the minimum probability value is higher than or equal to the threshold value, the detection result of the automated optical inspection apparatus is changed to a normal condition, and when the minimum probability value is lower than the threshold value, the detection result of the automated optical inspection apparatus is not changed, that is, the detection result of the automated optical inspection apparatus 10 is maintained.

The technical solution can solve the conventional technology problem that the conventional automated optical inspection for the pin solder joints of electronic components has a too low performance, so that the technical effect of providing an accurate detection result of automated optical inspection and improving a first pass yield can be achieved.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A secondary detection system for integrating automated optical inspection and neural network, comprising:

an automated optical inspection apparatus configured to perform automated optical inspection for pin solder joints on a circuit board, wherein when a detection result of the automated optical inspection for pin solder joints indicates an abnormal condition, the automated optical inspection apparatus provides an inspection image and detection result information of the automated optical inspection; and a secondary detection device, comprising:

an receiving module configured to receive the inspection image and the detection result information from the automated optical inspection apparatus;

an image capture module configured to capture a component image corresponding to an electronic component image scope in the inspection image according to electronic component information and location information contained in the detection result information;

an image query module configured to query a template image according to circuit board information contained in the detection result information;

a pin solder joint image module configured to capture a component pin solder joint image for each of pin solder joints in the component image and capture a template pin solder joint image for each of pin solder joints in the template image;

an image feature module configured to perform image feature extraction on the component image to generate a component image feature, perform image feature extraction on the template image to generate a template image feature, perform image feature extraction on the component pin solder joint image to generate a component pin solder joint image feature, and perform image feature extraction on the template pin solder joint image to generate a template pin solder joint image feature, through convolution neural network;

a probability calculation module configured to calculate a detection image probability value based on the component image feature and the template image feature and calculate a plurality of pin solder joint image probability value based on the component pin solder joint image feature and the template pin solder joint image feature corresponding to each other, through the siamese neural network; and a result determining module configured to obtain a minimum probability value among the detection image probability value and the plurality of pin solder joint image probability values, wherein when the minimum probability value is higher than or equal to a threshold value, the result determining module changes the detection result of the automated optical inspection apparatus to a normal condition, and when the minimum probability value is lower than the threshold value, the result determining module does not change the detection result of the automated optical inspection apparatus.

2. The secondary detection system for integrating automated optical inspection and neural network according to claim 1, wherein the convolution neural network performs image feature extraction based on different image feature, to generate feature matrixes of the component image feature, the template image feature, the component pin solder joint image feature and the template pin solder joint image feature corresponding to the image features.

3. The secondary detection system for integrating automated optical inspection and neural network according to claim 1, wherein in the siamese neural network, the template image feature is subtracted from the component image feature, and a dense layer outputs an output value, and the output value is converted by a sigmoid function (S function), so as to calculate the detection image probability value, wherein the detection image probability value is in a range of 0 to 1.

4. The secondary detection system for integrating automated optical inspection and neural network according to claim 1, wherein the siamese neural network, the template pin solder joint image feature is subtracted from the component pin solder joint image feature, a dense layer outputs a pin output value, and the pin output value is converted by a sigmoid function, to calculate the pin solder joint image probability value, wherein the pin solder joint image probability value is in a range of 0 to 1.

5. The secondary detection system for integrating automated optical inspection and neural network according to claim 1, wherein the image capture module performs image capture by using the location information contained the detection result information as a center to find a capture scope according to the electronic component information contained in the detection result information, so as to capture the component image within the electronic component image scope in the inspection image.

6. A secondary detection method for integrating automated optical inspection and neural network, comprising:

using an automated optical inspection apparatus to perform automated optical inspection for pin solder joints on a circuit board;

when a detection result of the automated optical inspection for the pin solder joints indicates an abnormal condition, using the automated optical inspection apparatus to provide an inspection image and detection result information of the automated optical inspection to a secondary detection device;

using the secondary detection device to capture a component image within an electronic component image scope in the inspection image according to electronic component information and location information contained in the detection result information;

using the secondary detection device to query a template image according to circuit board information contained in the detection result information;

using the secondary detection device to capture a component pin solder joint image for each of the pin solder joints in the component image;

using the secondary detection device to capture a template pin solder joint image for each of the pin solder joints in the template image;

using the secondary detection device to perform image feature extraction on the component image to generate a component image feature through a convolution neural network;

using the secondary detection device to perform image feature extraction on the template image to generate a template image feature through a convolution neural network;

using the secondary detection device to perform image feature extraction on the component pin solder joint image to generate a component pin solder joint image feature through a convolution neural network;

using the secondary detection device to perform image feature extraction on the template pin solder joint image to generate a template pin solder joint image feature through a convolution neural network;

using the secondary detection device, to calculate a detection image probability value based on the component image feature and the template image feature, through the siamese neural network;

using the secondary detection device, to calculate a plurality of pin solder joint image probability values based on the component pin solder joint image feature and the template pin solder joint image feature corresponding to each other;

using the secondary detection device to obtain a minimum probability value among the detection image probability value and the plurality of pin solder joint image probability values;

when the minimum probability value is higher than or equal to a threshold value, using the secondary detection device to change the detection result of the automated optical inspection apparatus to a normal condition; and when the minimum probability value is lower than the threshold value, maintaining the detection result of the automated optical inspection apparatus.

7. The secondary detection method for integrating automated optical inspection and neural network according to claim 6, wherein the convolution neural network performs image feature extraction based on different image feature, to generate feature matrixes? of the component image feature, the template image feature, the component pin solder joint image feature and the template pin solder joint image feature corresponding to the image feature.

8. The secondary detection method for integrating automated optical inspection and neural network according to claim 6, wherein in the siamese neural network, the template image feature is subtracted from the component image feature, and a dense layer outputs an output value, and the output value is converted by a sigmoid function (S function), so as to calculate the detection image probability value, wherein the detection image probability value is in a range of 0 to 1.

9. The secondary detection method for integrating automated optical inspection and neural network according to claim 6, wherein the siamese neural network, the template pin solder joint image feature is subtracted from the component pin solder joint image feature, a dense layer outputs a pin output value, and the pin output value is converted by a sigmoid function, to calculate the pin solder joint image probability value, wherein the pin solder joint image probability value is in a range of 0 to 1.

10. The secondary detection method for integrating automated optical inspection and neural network according to claim 6, wherein the step of using the secondary detection device to capture the component image within the electronic component image scope in the inspection image according to the electronic component information and the location information contained in the detection result information, comprises:

performing the image capture by using the location information contained the detection result information as a center to find a capture scope according to the electronic component information contained in the detection result information, so as to capture the component image within the electronic component image scope in the inspection image.

* * * * *